(12) United States Patent
Shapiro et al.

(10) Patent No.: US 11,190,183 B2
(45) Date of Patent: *Nov. 30, 2021

(54) HIGH THROW-COUNT RF SWITCH

(71) Applicant: pSemi Corporation, San Diego, CA (US)

(72) Inventors: Eric S. Shapiro, San Diego, CA (US); Payman Shanjani, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/989,462

(22) Filed: Aug. 10, 2020

(65) Prior Publication Data

US 2021/0028783 A1 Jan. 28, 2021

Related U.S. Application Data

(60) Continuation of application No. 16/239,444, filed on Jan. 3, 2019, now Pat. No. 10,771,059, which is a (Continued)

(51) Int. Cl.
*H03K 17/693* (2006.01)
*H03K 17/62* (2006.01)
(Continued)

(52) U.S. Cl.
CPC ........... *H03K 17/693* (2013.01); *H03K 17/62* (2013.01); *H03K 17/76* (2013.01); *H04B 1/0458* (2013.01);
(Continued)

(58) Field of Classification Search
CPC .................................................... H03K 17/693
See application file for complete search history.

(56) References Cited

U.S. PATENT DOCUMENTS

| 5,777,530 A | 7/1998 | Nakatuka |
| 5,856,713 A | 1/1999 | Huettner et al. |
| (Continued) | | |

FOREIGN PATENT DOCUMENTS

| EP | 1357630 | 10/2003 |
| GB | 2406981 | 4/2005 |
| WO | 2017139024 | 8/2017 |

OTHER PUBLICATIONS

Cole, Brandon S., Office Action received from the USPTO dated Dec. 23, 2016 for U.S. Appl. No. 15/019,882, 6 pgs.

(Continued)

*Primary Examiner* — Hai L Nguyen
(74) *Attorney, Agent, or Firm* — Jaquez Land Greenhaus & McFarland LLP; John Land, Esq.

(57) ABSTRACT

A high throw-count multiple-pole FET-based RF switch architecture that provides good RF performance in terms of insertion loss, return loss, isolation, linearity, and power handling. A common port RFC is coupled along a common path to multiple ports RFn. Embodiments introduce additional common RF path branch isolation switches which are controlled by state dependent logic. The branch isolation switches help to isolate the unused branch ports RFn and the unused portion of the common path from the active portion of the common path, and thereby reduce the reactive load attributable to such branches that degrades RF performance of the ports RFn "closer" to the common port RFC. The branch isolation switches can also be used to reconfigure the switch architecture for a multiplex function as well as separate switch path banks for re-configurability of purpose, tuning, or varying switch throw counts and packaging options.

20 Claims, 7 Drawing Sheets

Related U.S. Application Data continuation of application No. 15/970,778, filed on May 3, 2018, now Pat. No. 10,181,850, which is a division of application No. 15/019,882, filed on Feb. 9, 2016, now Pat. No. 9,991,889.

(51) Int. Cl.
   *H04B 1/04* (2006.01)
   *H04B 1/48* (2006.01)
   *H03K 17/76* (2006.01)
   *H03K 17/06* (2006.01)

(52) U.S. Cl.
   CPC ......... *H04B 1/48* (2013.01); *H03K 2017/066* (2013.01); *H04B 2001/485* (2013.01)

(56) References Cited

U.S. PATENT DOCUMENTS

| | | | |
|---|---|---|---|
| 7,345,545 B2 | 3/2008 | Glass et al. | |
| 8,039,880 B2 | 10/2011 | Tayrani et al. | |
| 8,368,451 B2* | 2/2013 | Mulawski | H03K 17/6871 327/308 |
| 8,583,111 B2* | 11/2013 | Burgener | H03K 17/693 455/433 |
| 8,604,864 B2* | 12/2013 | Ranta | H03K 17/687 327/427 |
| 8,660,603 B2 | 2/2014 | Block et al. | |
| 8,963,618 B2 | 2/2015 | Keane | |
| 9,035,716 B2 | 5/2015 | Tanji et al. | |
| 9,100,060 B2* | 8/2015 | Ilkov | H04B 1/0057 |
| 9,143,184 B2* | 9/2015 | Gorbachov | H04B 1/48 |
| 9,270,263 B2 | 2/2016 | Iwaki | |
| 9,425,782 B2 | 8/2016 | Jeong | |
| 9,530,797 B2 | 12/2016 | Kunishi et al. | |
| 9,628,070 B2 | 4/2017 | Jang et al. | |
| 9,991,889 B2 | 6/2018 | Shapiro et al. | |
| 10,181,850 B2 | 1/2019 | Shapiro et al. | |
| 10,771,059 B2 | 9/2020 | Shapiro et al. | |
| 2004/0141470 A1 | 7/2004 | Kelcourse et al. | |
| 2006/0199563 A1 | 9/2006 | Kelly et al. | |
| 2007/0103252 A1 | 5/2007 | Nakatsuka | |
| 2007/0213015 A1 | 9/2007 | Nagano et al. | |
| 2008/0290928 A1 | 11/2008 | Kawakyu et al. | |
| 2009/0093270 A1 | 4/2009 | Block et al. | |
| 2009/0295515 A1 | 12/2009 | Vice | |
| 2011/0105055 A1 | 5/2011 | Ilkov | |
| 2011/0140754 A1 | 6/2011 | Tokunaga et al. | |
| 2011/0140763 A1 | 6/2011 | Noh et al. | |
| 2012/0068785 A1 | 3/2012 | Seshita | |
| 2012/0182061 A1 | 7/2012 | Seshita et al. | |
| 2012/0319755 A1 | 12/2012 | Zhang | |
| 2013/0072134 A1 | 3/2013 | Goto et al. | |
| 2014/0009203 A1 | 1/2014 | Cebi et al. | |
| 2014/0062575 A1 | 3/2014 | Hurwitz | |
| 2014/0240030 A1 | 8/2014 | Teraguchi | |
| 2015/0070075 A1 | 3/2015 | Keane | |
| 2015/0162901 A1 | 6/2015 | Lu et al. | |
| 2015/0188600 A1 | 7/2015 | Kang et al. | |
| 2015/0348993 A1 | 12/2015 | Kunishi et al. | |
| 2016/0126943 A1 | 5/2016 | Bacon | |
| 2017/0230049 A1 | 8/2017 | Shapiro et al. | |
| 2018/0254777 A1 | 9/2018 | Shapiro et al. | |
| 2019/0199348 A1 | 6/2019 | Shapiro et al. | |

OTHER PUBLICATIONS

Cole, Brandon S., Office Action received from the USPTO dated Mar. 6, 2017 for U.S. Appl. No. 15/019,882, 17 pgs.
Cole, Brandon S., Office Action received from the USPTO dated Jul. 24, 2017 for U.S. Appl. No. 15/019,882, 22 pgs.
Cole, Brandon S., Final Office Action received from the USPTO dated Dec. 18, 2017 for U.S. Appl. No. 15/019,882, 28 pgs.
Cole, Brandon S., Advisory Action received from the USPTO dated Feb. 26, 2018 for U.S. Appl. No. 15/019,882, 8 pgs.
Cole, Brandon S., Notice of Allowance received from the USPTO dated Apr. 9, 2018 for U.S. Appl. No. 15/019,882, 5 pgs.
Shaprio, et al., Response filed in the USPTO dated Feb. 10, 2017 for U.S. Appl. No. 15/019,882, 13 pgs.
Shaprio, et al., Response filed in the USPTO dated May 24, 2017 for U.S. Appl. No. 15/019,882, 19 pgs.
Shaprio, et al., Response filed in the USPTO dated Oct. 9, 2017 for U.S. Appl. No. 15/019,882, 20 pgs.
Shaprio, et al., Response filed in the USPTO dated Feb. 12, 2018 for U.S. Appl. No. 15/019,882, 20 pgs.
Skyworks Solutions, Inc., "SKY13418-485LF: 0.1 to 3.0 GHz SP8T Antenna Switch" Data Sheet, Sep. 10, 2014, pp. 1-12.
Analog Devices, Hittite Microwave Products, Analog Devices Welcomes Hittite Microwave Corporation, "GaAs MMIC SP8T Non-Reflective Positive Control Switch, DC*—8 GHz", HMC321LP4/321LP4E, vol. 03.0805, Oct. 15, 2015, 8 pgs.
Rasmussen, Sine, International Search Report and Written Opinion received from the EPO dated Mar. 7, 2017 for appln. No. PCT/US2016/067055, 15 pgs.
Peregrine Semiconductor Corporation, Demand and Amendment filed in the EPO dated Sep. 1, 2017 for appln. No. PCT/2016/067055, 25 pgs.
Loiseau, Ludovic, Written Opinion received from the EPO dated Jan. 17, 2018 for appln. No. PCT.US2016/067055, 11 pgs.
Dole, Brandon S., Office Action received from the USPTO dated Jun. 6, 2018 for U.S. Appl. No. 15/970,778, 8 pgs.
Cole, Brandon S., Notice of Allowance received from the USPTO dated Sep. 28, 2018 for U.S. Appl. No. 15/970,778, 13 pgs.
Shaprio, et al. Response filed in the USPTO dated Jun. 8, 2018 for U.S. Appl. No. 15/970,778, 6 pgs.
Matthys, Griet, International Preliminary Report on Patentability received from the EPO dated Apr. 25, 2018 for appln. No. PCT/US2016/067055, 27 pgs.
Nguyen, Hai L., Office Action received from the USPTO dated Jan. 22, 2020 for U.S. Appl. No. 16/239,444, 24 pgs.
Nguyen, Hai L., Notice of Allowance received from the USPTO dated May 5, 2020 for U.S. Appl. No. 16/239,444, 8 pgs.
pSemi Corporation, Preliminary Amendment filed in the USPTO dated Mar. 13, 2019 or U.S. Appl. No. 16/239,444, 6 pgs.
pSemi Corporation, Response filed in the USPTO dated Apr. 21, 2020 or U.S. Appl. No. 16/239,444, 10 pgs.

* cited by examiner

HIGH THROW-COUNT RF SWITCH

CROSS-REFERENCE TO RELATED APPLICATIONS—CLAIM OF PRIORITY

The present application is a continuation of U.S. application Ser. No. 16/239,444, filed Jan. 3, 2019, entitled "High Throw-Count RF Switch" (now U.S. Pat. No. 10,771,059, issued Sep. 8, 2020), which is herein incorporated by reference in its entirety; application Ser. No. 16/239,444 is a continuation of U.S. application Ser. No. 15/970,778, filed May 3, 2018, entitled "High Throw-Count RF Switch" (now U.S. Pat. No. 10,181,850 issued Jan. 15, 2019), which is herein incorporated by reference in its entirety; application Ser. No. 15/970,778 is a divisional of U.S. application Ser. No. 15/019,882, filed Feb. 9, 2016, entitled "High Throw-Count RF Switch" (now U.S. Pat. No. 9,991,889 issued Jun. 5, 2018), which is herein incorporated by reference in its entirety.

BACKGROUND

(1) Technical Field

This invention generally relates to electronic circuits, and more specifically to radio frequency (RF) switch circuits utilizing field effect transistors (FETs).

(2) Background

Electronic signal switches are used in a wide variety of applications. In particular, a multiple-pole FET-based RF switch architecture has been found useful in applications which require multiple transmit and/or receive paths for RF signals. For example, such a switch architecture is useful in cellular radio systems for coupling multiple antennas to multiple sets of transmit/receive circuitry. Other examples include automatic test equipment and electronics laboratory bench measurement equipment.

A FET may be fabricated in various technologies (e.g., standard bulk silicon, silicon-on-insulator, silicon-on-sapphire, GaN HEMT, GaAs pHEMT, and MESFET processes) and is commonly represented in schematic diagrams as an idealized ON-OFF switch device. However, in many applications, particularly in RF circuits, the structure and materials of a FET may have significant effects on its own operation (e.g., with respect to bandwidth, isolation, and power handling) and the presence of a FET may have significant effects on other components in a circuit. Such effects arise in part because a "CLOSED" or "ON" (i.e., low impedance or conductive) FET has a non-zero resistance, and an "OPEN" or "OFF" (i.e., high impedance or blocking) FET behaves as a capacitor due to parasitic capacitances arising from the proximity of various semiconductor structures, particularly within the close confines of an integrated circuit (IC). Moreover, in a multiple-pole FET-based RF switch IC, added impedance elements (e.g., inductors and/or transmission lines) as well as parasitic inductances caused by interconnections between FETs and by other circuit structures complicate the design of such an IC.

To date, such complications have limited the number of available transmit and/or receive paths in a multiple-pole FET-based RF switch to about 8 ports (plus a common port), and RF performance has been less than stellar. In general, increasing the number of paths for an RF switch results in trade-offs with bandwidth and insertion loss (IL). Additionally, adding throw counts creates extra parasitic inductances along signal paths which degrade performance due to asymmetry when different signal paths are active. For example, a conventional 8 or 12 throw solid state switch has generally been limited to about a 3 GHz broadband response. As another example, some 8 throw switches fabricated in GaAs have been created with useful bandwidths up to about 8 GHz, but at the expense of insertion loss, return loss quality, isolation, and linearity/power compression point.

Accordingly, there is a need for a high throw-count multiple-pole FET-based RF switch architecture that provides good RF performance. The present invention meets such needs.

SUMMARY OF THE INVENTION

The present invention encompasses a high throw-count multiple-pole FET-based RF switch architecture that provides good RF performance in terms of insertion loss, return loss, isolation, linearity, and power handling. In general, embodiments of the invention introduce additional common RF path branch isolation switches which are controlled by state dependent logic. The common RF path branch isolation switches can also be used to reconfigure the switch architecture for a multiplex function as well as separate switch path banks for re-configurability.

In various embodiments, a common port RFC is coupled along a common path to multiple signal ports RFn. Each port RFn connects to the common path through a series-shunt switching element comprising a FET series switch and a FET shunt switch connected to circuit ground. To couple any port RFn to the common port RFC through the common path, the corresponding series switch is set to ON and the corresponding shunt switch is set to OFF. To decouple any port RFn from the common port RFC, the corresponding the series switch is set to OFF and the corresponding shunt switch is set to ON. Control circuitry is coupled to the gates of each FET of each RFn port to set such ON or OFF states, in known fashion.

The added branch isolation switches are normally OFF (blocking), and only turned ON (conducting) when associated "far side" ports RFn are to be coupled to the common port RFC. The OFF state of each branch isolation switch helps to isolate the inactive branch ports RFn and the unused portion of the common path from the active, in-use portion of the common path. Thus, the branch isolation switches are used to effectively disconnect (i.e., isolate) inactive branches and thereby reduce the reactive load attributable to such branches that would otherwise degrade the RF performance of the ports RFn "closer" to the common port RFC. Reducing the reactive load on the common RF connection port significantly extends the operating bandwidth.

Embodiments of the invention provide good RF performance at high frequencies with switch throw-counts of more than 8 while exceeding the RF performance of conventional switch circuits with throw-counts of 8 or less at the same or lower frequencies.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The present invention encompasses a high throw-count multiple-pole FET-based RF switch architecture that provides good RF performance in terms of insertion loss, return loss, isolation, linearity, and power handling. In general, embodiments of the invention introduce additional common RF path branch isolation switches which are controlled by state dependent logic. The common RF path branch isolation switches can also be used to reconfigure the switch architecture for a multiplex function as well as separate switch path banks for re-configurability.

Design Challenges

Figure 1:
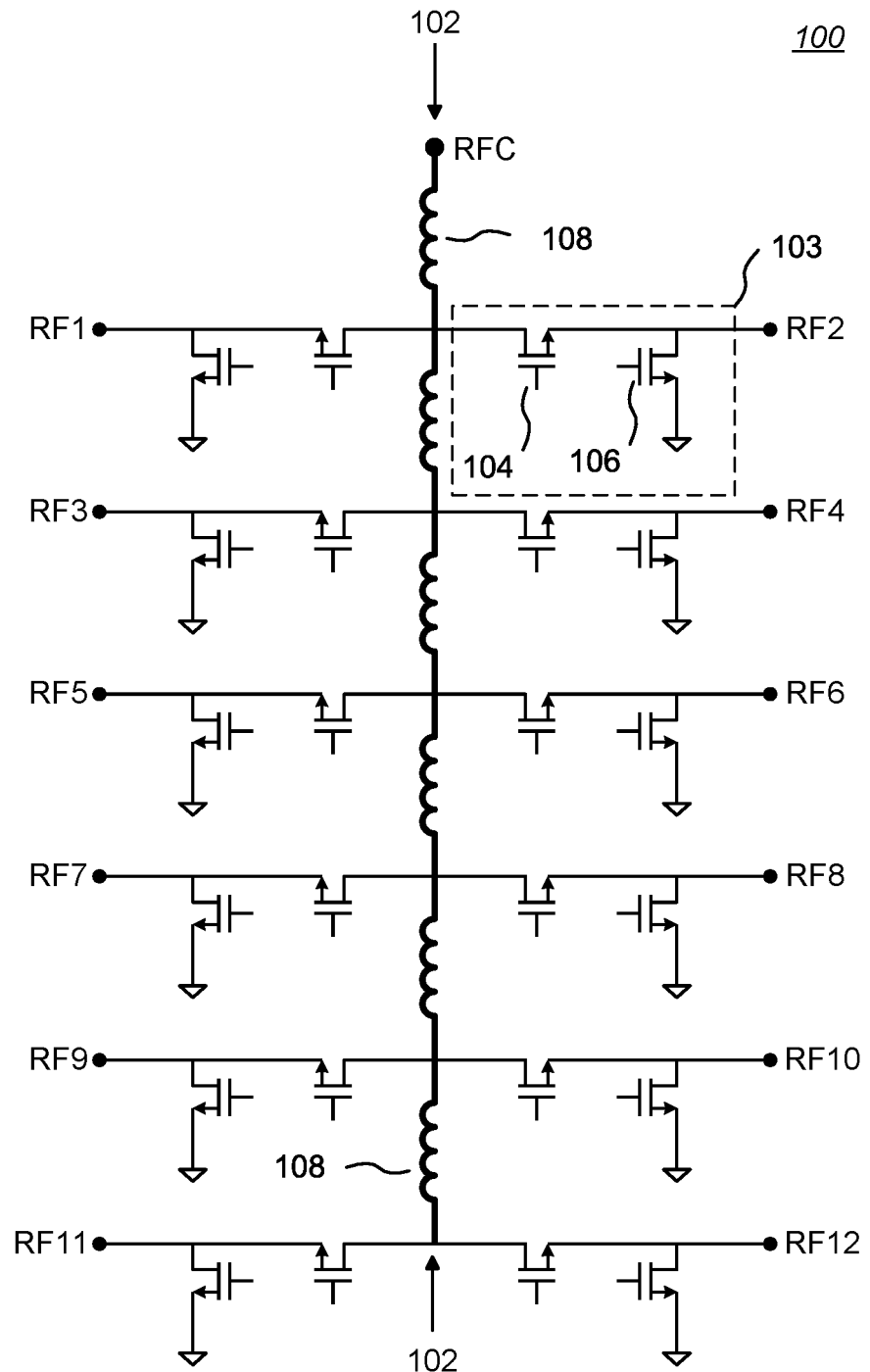
FIG. 1 is a schematic diagram of a multiple-pole FET-based RF switch architecture that illustrates some of the challenges of designing a high throw-count RF switch.

FIG. 1 is a schematic diagram of a multiple-pole FET-based RF switch architecture 100 that illustrates some of the challenges of designing a high throw-count RF switch. In the illustrated example, a common port RFC is coupled along a common path 102 (shown bolded) to a number of signal ports RFn; 12 signal ports are shown by way of example. Taking port RF2 as an example of a unit cell, each port connects to the common path 102 through a series-shunt switching element 103 comprising a FET series switch 104 and a FET shunt switch 106 coupled between circuit ground and the corresponding port (corresponding reference numbers for the other ports RFn have been omitted to avoid clutter). To couple any port RFn to the common port RFC through the common path 102, the corresponding series switch 104 is set to ON (conducting) and the corresponding shunt switch 106 is set to OFF (blocking). To decouple any port RFn from the common port RFC, the corresponding the series switch 104 is set to OFF and the corresponding shunt switch 106 is set to ON. Control circuitry, not shown, is coupled to the gates of each FET of each RFn port to set such ON or OFF states, in known fashion.

Figure 2A:
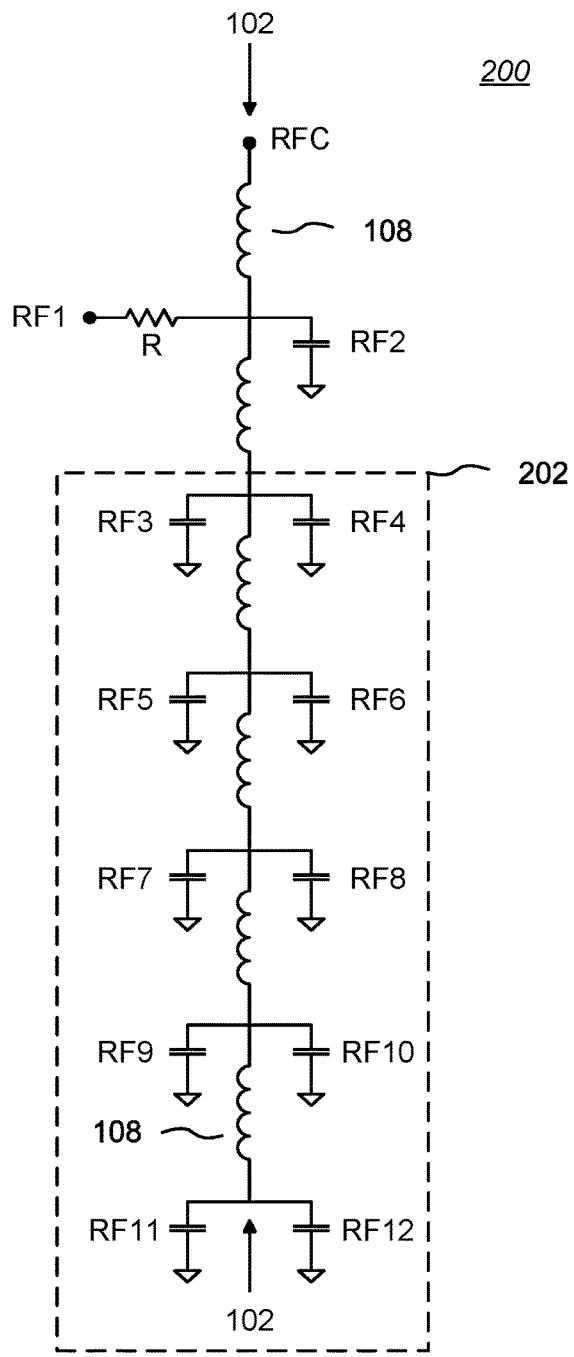
FIG. 2A is a schematic diagram of one specific configuration of a high throw-count RF switch showing the equivalent circuit when RF1 is ON and all other paths are OFF.

In a practical integrated circuit (IC) layout, parasitic inductances and capacitances along the common path 102 do not allow for good return loss for all states/paths. Such inductances are shown as equivalent discrete inductors 108 in FIG. 1, but the inductance values of each sub-path normally differ. Some paths may benefit from the common path inductance, while others may be degraded. For example, if the RF12 path is ON and all others are OFF, the distributed capacitive loading from all of the OFF paths can tune the performance acceptably by the method of an L-C-L-C approximation of a transmission line. However, when RF1 is ON and all other paths are OFF, the resulting excessive parasitic loading would severely inhibit the performance of RF1. For example, FIG. 2A is a schematic diagram of one specific configuration of a high throw-count RF switch 200 showing the equivalent circuit when RF1 is ON and all other paths are OFF. More specifically, in the illustrated example, common port RFC is coupled to active port RF1, while inactive ports RF2-RF12 are decoupled from the common path 102. For port RF1, the corresponding series switch is set to ON and the corresponding shunt switch is set to OFF, and thus port RF1 can be represented as a resistor R coupled to the common path 102. Conversely, the corresponding series switch of each of the decoupled ports RF2-RF12 is set to OFF and the corresponding shunt switch is set to ON, and thus each of the decoupled ports RF2-RF12 can be represented as a capacitor. At least the components within the bounding box 202 impose a parasitic load on RF1. Package bond wire inductance further hampers achieving a desired bandwidth. "Flip chip" packaging of an IC may help somewhat but is generally a relatively expensive option, and there is still the on-chip inductance and capacitive loading issue for large port counts.

A design can be performance optimized for the "closest" ports to the common port RFC (e.g., RF1 and RF2), but the performance of other ports suffers. Similarly, if a design is performance optimized for the "farthest" ports from the common port RFC (e.g., RF11 and RF12), which experience the most intervening inductance, the performance of the closest ports suffers.

Figure 2B:
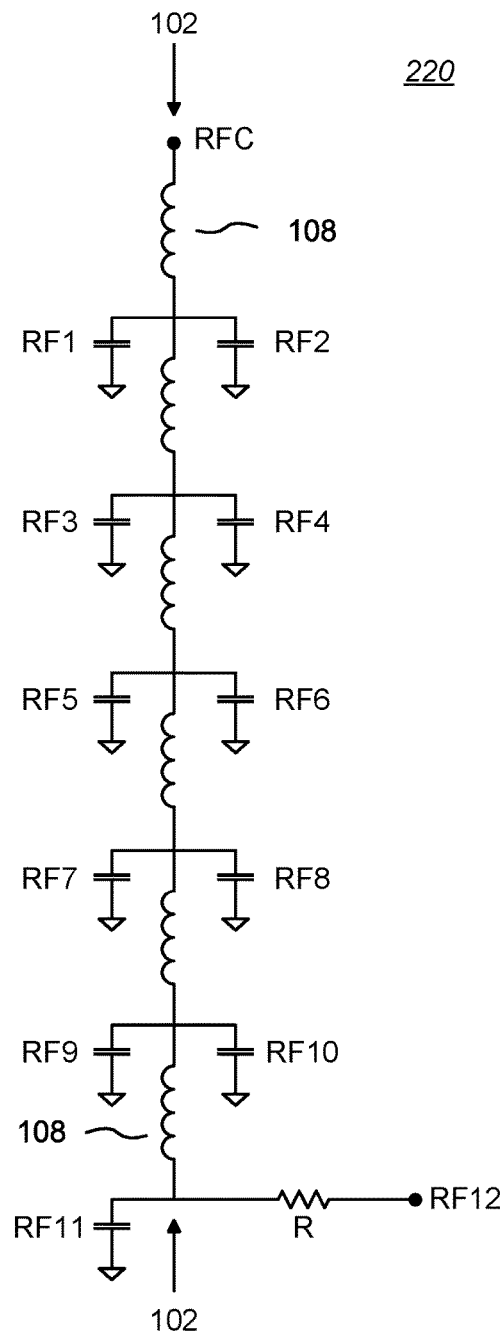
FIG. 2B is a schematic diagram of one specific configuration of a high throw-count RF switch showing the equivalent circuit when RF12 is ON and all other paths are OFF.

Thus, for example, FIG. 2B is a schematic diagram of one specific configuration of a high throw-count RF switch 220 showing the equivalent circuit when RF12 is ON and all other paths are OFF. More specifically, in the illustrated example, common port RFC is coupled to active port RF12, while inactive ports RF1-RF11 are decoupled from the common path 102. For port RF12, the corresponding series switch is set to ON and the corresponding shunt switch is set to OFF, and thus port RF12 can be represented as a resistor R coupled to the common path 102. Conversely, the corresponding series switch of each of the decoupled ports RF1-RF11 is set to OFF and the corresponding shunt switch is set to ON, and thus each of the decoupled ports RF1-RF11 can be represented as a capacitor.

In one model of the switch 220 of FIG. 2B, the circuit was optimized to get "good" return loss for the path to port RF12. The RF performance of each individual port was tuned by increasing or decreasing the size of a unit cell's series FET (thus changing the off capacitance, CUFF, of the unit cell) to adjust the artificial characteristic impedance (i.e., L-C . . . L-C) of the entire switch 220 as seen at the RFC port. TABLE 1 shows the insertion loss, return loss, and isolation figures for the modeled circuit at 6 GHz and 8 GHz for three RF signal path states: RFC-RF1, RFC-RF6, and RFC-RF12. As can be seen, insertion loss, return loss, and isolation at port RF12 are good due to the optimization for that port, but are worse (sometimes much worse) for the other two ports, RF1 and RF6. The values marked with an asterisk indicate extremely poor performance due to extreme resonances resulting from excessive parasitic reactive loading under the specified conditions, resulting in high insertion loss and reflections at the ports near the common terminal and at higher frequencies. As a result, maximum operating frequency for the example 12T configuration is likely in the 2-3 GHz range.

TABLE 1

| State | Insertion Loss<br>dB @ 6 GHz<br>dB @ 8 GHz | Return Loss<br>dB up to 6 GHz<br>dB up to 8 GHz | Isolation<br>dB @ 6 GHz<br>dB @ 8 GHz |
|---|---|---|---|
| 1 | 3* | 3* | 30 |
|   | 24* | 1* | 30 |
| 6 | 0.82 | 12 | 33 |
|   | 2.4* | 5* | 27.5 |
| 12 | 0.55 | 14.5 | 35 |
|   | 0.62 | 14.5 | 30 |

Another design challenge has to do with IC packaging. Lower cost packaging—such as wire bonding in plastic enclosure packages—has cost advantages but has the challenge of inductive parasitics from wire bonds, which can limit bandwidth beyond some initial RF tuning advantages. A larger number of RF ports (for example, more than 6 ports) requires larger wire bond packages to accommodate additional package pins and maintain isolation. For a given die size, a larger package size requirement increases the length of the wire bonds.

To overcome these design challenges, embodiments of the invention introduce additional common RF path switches controlled by state dependent logic, as described in the following sections. More particularly, instead of connecting all signal path branches through switches to the common path 102 leading to the common port RFC, embodiments of the invention extend the switch circuit bandwidth and other performance characteristics by creating switch bank groupings accessed through FET series branch isolation switches to reduce the reactive loading on the common path 102, and thus on the common port RFC. In doing so, the additional insertion loss of the added series branch isolation switches is balanced against the isolation required to accomplish improved bandwidth and other performance characteristics. Specifically, the ON resistance $R_{ON}$ of a switch (which results in RF loss) is a direct trade-off with the OFF capacitance $C_{OFF}$ of the switch (which creates RF isolation).

Further, embodiments of the invention help reduce bond wire length by allowing a designer to split the common path 102 into two or more directions using series branch isolation switches. The series branch isolation switches are designed to be robust under high RF voltage conditions since in an OFF state (for isolation), a FET switch would experience a large applied voltage. Accordingly, appropriately designing, sizing, and stacking FET devices is required for the series branch isolation switch.

First Embodiment

Figure 3:
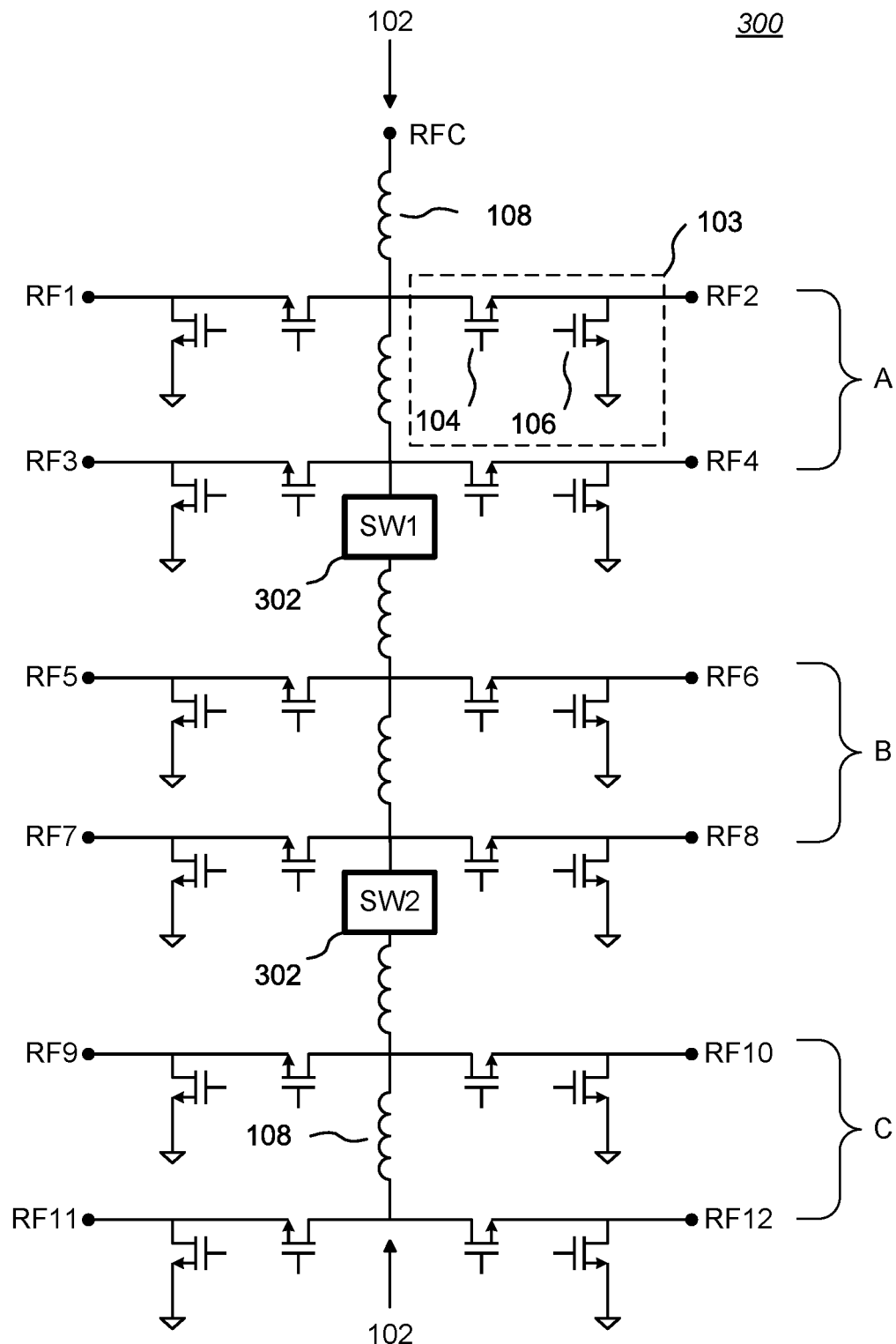
FIG. 3 is a schematic diagram of a first embodiment of a high throw-count RF switch in conformance with the present invention.

FIG. 3 is a schematic diagram of a first embodiment of a high throw-count RF switch 300 in conformance with the present invention. In the illustrated embodiment, the general switch architecture of FIG. 1 has been modified to include one or more branch isolation (BI) switches 302. Each BI switch 302 is independently switchable, the ON-OFF state of which depends on which port RFn is to be coupled to the common port RFC. In the illustrated example, two BI switches 302 (SW1 and SW2) define three sections A, B, C of branches. The control logic for the two BI switches 302 as a function of a single active port RFn would be as set forth in TABLE 2. Note that the RF1-RF12 designations may be assigned in any order; they are merely a label name for each port.

TABLE 2

| Section | Active Port | BI Switch State |
|---|---|---|
| A | RF1-RF4 | SW1 = OFF |
|   |   | SW2 = OFF |
| B | RF5-RF8 | SW1 = ON |
|   |   | SW2 = OFF |
| C | RF9-RF12 | SW1 = ON |
|   |   | SW2 = ON |

Accordingly, the BI switches 302 are normally OFF (blocking), and only turned ON (conducting) when associated "far side" ports RFn are to be coupled to the common port RFC. The OFF state of each BI switch 302 helps to isolate the inactive branch ports RFn and the unused portion of the common path 102 from the active, in-use portion of the common path 102. Thus, the BI switches 302 are used to effectively disconnect (i.e., isolate) inactive branches and thereby reduce the reactive load attributable to such branches that would otherwise degrade the RF performance of the ports RFn "closer" to the common port RFC.

Each BI switch 302 may be implemented as an independently switchable FET. Alternatively, each BI switch 302 may instead comprise a stack of serially-connected FETs sufficient to handle any incident voltage and concurrently operated to behave as a single single-pole, single-throw (SPST) switch. (See also the description below regarding respect to FIG. 7.)

In the example as illustrated, 12 ports RFn are shown. However, more or fewer than ports may be included, depending on the needs of a particular application. The example also shows two BI switches 302 (SW1 and SW2), but more or fewer (but at least one) may be used. One point of note is that adding more BI switches 302 increases the insertion loss of "far side" ports RFn, so it is useful to balance the number of BI switches 302 against the increased performance they provide.

TABLE 3 shows the insertion loss, return loss, and isolation figures for a model of the BI switch-based circuit shown in FIG. 3 at 6 GHz and 8 GHz, otherwise using the same assumptions for circuit components as in FIG. 2B. The results for three RF signal path states (RFC-RF1, RFC-RF6, and RFC-RF12) compared to TABLE 1 show greatly improved insertion loss, return loss, and isolation figures for most configuration states, with only the insertion loss figure for the RFC-RF12 signal path being slightly worse. This slightly worse IL measurement is attributable to the added series impedance of the interposed BI switches 302, SW1 and SW2.

TABLE 3

| State | Insertion Loss<br>dB @ 6 GHz<br>dB @ 8 GHz | Return Loss<br>dB up to 6 GHz<br>dB up to 8 GHz | Isolation<br>dB @ 6 GHz<br>dB @ 8 GHz |
|---|---|---|---|
| 1 |  |  |  |
| SW1 = OFF | 0.50 | 22 | 35 |
| SW2 = OFF | 0.51 | 22 | 29 |
| 6 |  |  |  |
| SW1 = ON | 0.60 | 20 | 36 |
| SW2 = OFF | 0.85 | 14 | 31 |
| 12 |  |  |  |

TABLE 3-continued

| State | Insertion Loss<br>dB @ 6 GHz<br>dB @ 8 GHz | Return Loss<br>dB up to 6 GHz<br>dB up to 8 GHz | Isolation<br>dB @ 6 GHz<br>dB @ 8 GHz |
|---|---|---|---|
| SW1 = ON | 0.70 | 14.6 | 35 |
| SW2 = ON | 0.80 | 14.6 | 31 |

In some modes of operation, multiple signal ports RFn may be activated so as to operatively connect to the common port RFC; if so, the BI switches 302 corresponding to such signal ports RFn would be set to ON.

In an alternative operational mode, the RF switch 300 shown in FIG. 3 may be configured as a switch matrix so as to enable connecting any RFn port to any other RFn port through appropriate control of the series-shunt switching elements 103 corresponding to such ports (no connection would be made to the common port RFC). The BI switches 302 mitigate parasitic loading issues in particular configurations. For example, with SW1 in an OFF (non-conducting) state, a connection can be made between any two of RF1-RF4 in isolation from the common path 102 on the "far side" of SW1 (i.e., with inactive ports RF5-RF12 isolated). As another example, with SW1 in an ON (conducting) state and SW2 in an OFF state, a connection can be made between any one two of RF1-RF8 in isolation from the common path 102 on the "far side" of SW2 (of course, in this mode, at least one of RF5-RF8 should be an active port). As yet another example, with SW1 and SW2 both in an ON (conducting) state, a connection can be made between any two of RF1-RF12 (of course, in this mode, at least one of RF9-RF12 should be an active port).

Moreover, by selectively activating the BI switches 302, multiple banks of matrix switches can be enabled for concurrent operation. For example, with SW1 in an OFF state and SW2 in an ON state, a connection can be made between RF1 and RF2 concurrently with a connection between RF5 and RF11 (i.e., bank 1 comprises RF1-RF4, while bank 2 comprises RF5-RF12). As another example, with both SW1 and SW2 in an OFF state, concurrent connections can be made between RF1 and RF3, RF6 and RF8, and RF10 and RF11, since each of such pairs are located in distinct banks of ports separated by the BI switches 302 (i.e., bank 1 comprises RF1-RF4, bank 2 comprises RF5-RF8, and bank 3 comprises RF9-RF12).

Second Embodiment

Figure 4:
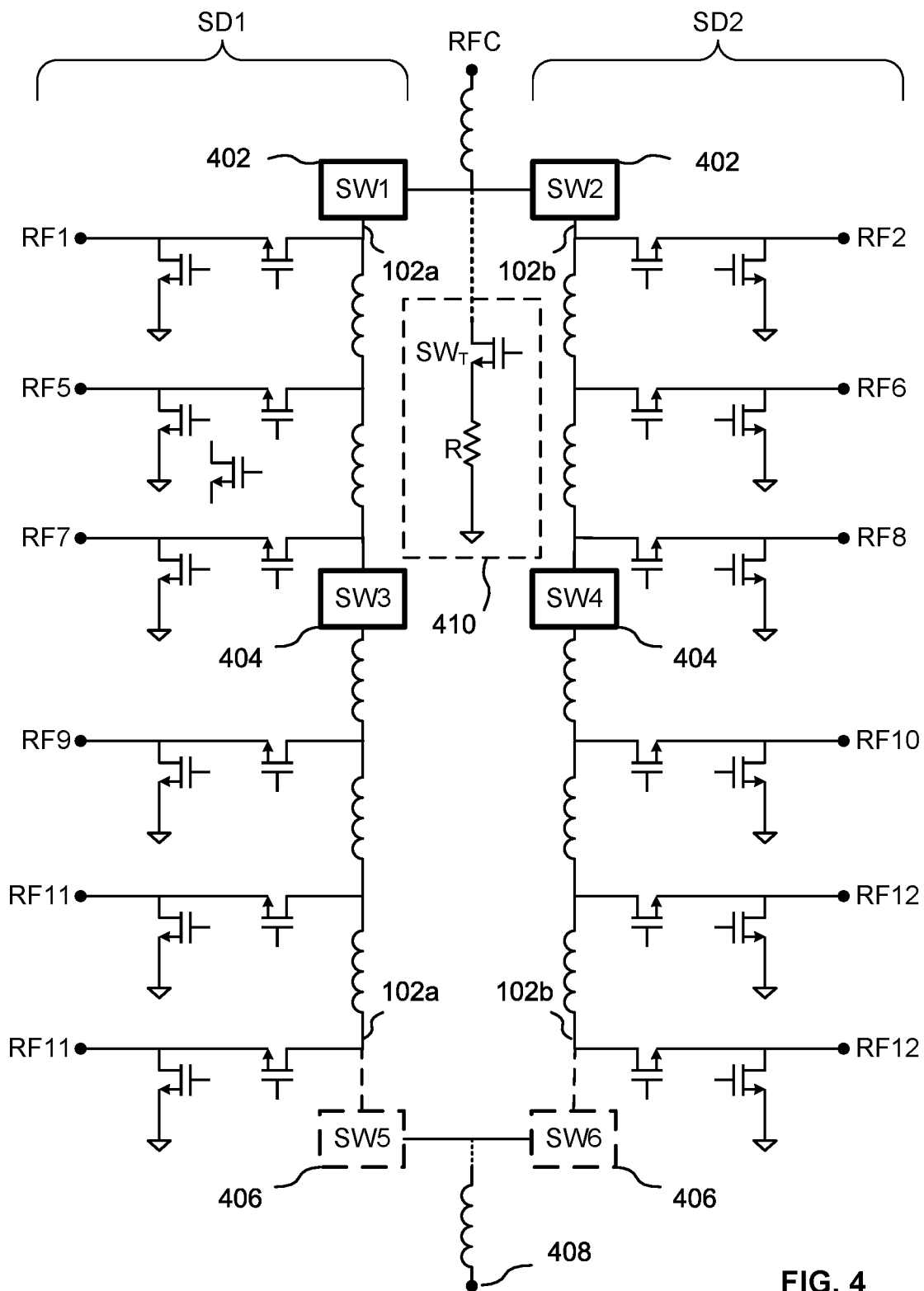
FIG. 4 is a schematic diagram of a second embodiment of a high throw-count RF switch in conformance with the present invention.

FIG. 4 is a schematic diagram of a second embodiment of a high throw-count RF switch 400 in conformance with the present invention. The RFn ports are divided into two or more sub-divisions (two are shown, SD1, SD2), each having a common path 102a, 102b coupled to the common port RFC by a corresponding main branch isolation (BI) switch 402; two such switches SW1, SW2 are shown in the illustrated example. Within each sub-division SDn, further BI switches 404 may define separate sections or banks of ports RFn as in FIG. 3; one such switch (SW3, SW4) per sub-division SD1, SD2 is shown.

The illustrated configuration may be useful for certain package sizes (e.g., a 4×4 pad or pin package) and/or an application requirement calling for short IC bond wires to the RFn ports. The main BI switches 402 may help to bridge such distances and reduce IL for each signal path. Note that some optimization of FET switch widths for the series FETs of each port RFn may be necessary as well to compensate for the added $C_{OFF}$ of the BI switches 404. There also may be a benefit to optimize the inductances between the various switches and the branches. The FET sizes may also be varied or tapered for optimization with respect to the added $C_{OFF}$ of the BI switches 404.

In an alternative configuration, additional cross-connection switches 406 (SW5, SW6 are shown) may be added to facilitate use of the RF switch 400 in a switch matrix operational mode, as described above with respect to FIG. 3. As yet another option, another common connection port 408 may be added between a pair of cross-connection switches 406 to facilitate connection of any of the RFn ports to two or more external elements (e.g., two separate antennas).

As in FIG. 3, the added common path switches SW1-SW6 may be implemented as an independently switchable FET or stack of FETs.

In some applications, it may be useful to fully isolate the common port RFC in order to allow an "all-OFF" state to provide high-isolation with respect to external circuitry. Accordingly, it may be useful to operatively couple a termination circuit 410 to the common port RFC. The termination circuit 410 may, for example, comprise a termination switch SW1 and a resistor R. Alternatively, an absorptive switch module of the type described below with respect to FIG. 6 may be used for the termination circuit 410, and branch isolation switches SW1 and SW2 may be set to appropriate states to aid in isolating absorptive termination of the common port RFC and improve its bandwidth.

Third Embodiment

Figure 5:
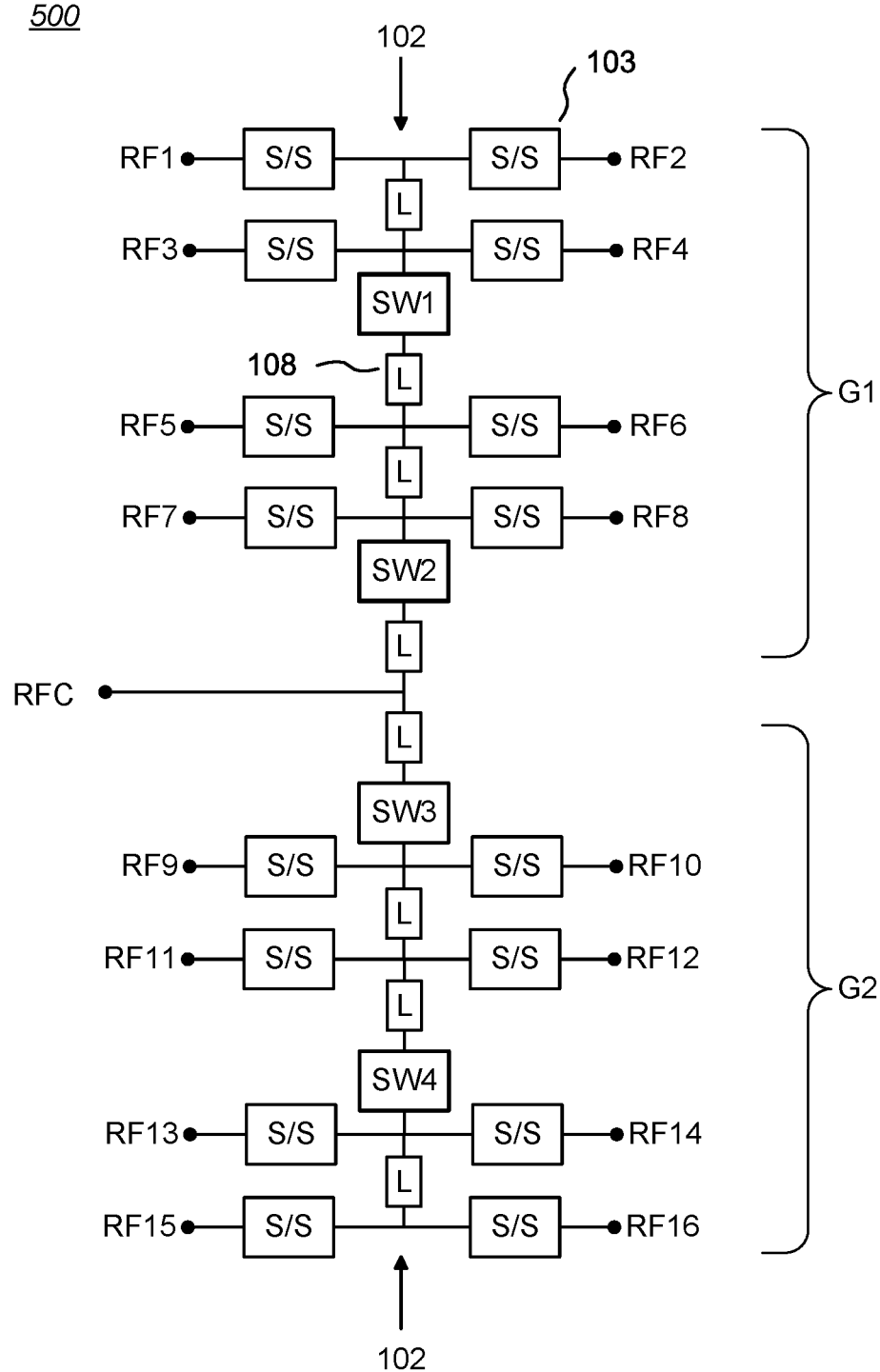
FIG. 5 is a schematic diagram of a third embodiment of a high throw-count RF switch in conformance with the present invention.

FIG. 5 is a schematic diagram of a third embodiment of a high throw-count RF switch 500 in conformance with the present invention. For compactness, the series-shunt switching elements 103 of FIG. 3 are shown as blocks labeled "S/S", and the various inductors 108 of FIG. 3 are shown as blocks labeled "L".

In the illustrated example, the common port RFC is positioned between the ends of the common path 102. The signal ports RFn (16 are shown by way of example) are coupled to the common path 102 so as to form multiple sub-groups (two are shown, G1, G2) of signal ports in a "butterfly" configuration (i.e., multiple banks Gn of signal ports arrayed around a centrally positioned common port RFC; thus, the concept is scalable). The common port RFC can be coupled to any of the ports RFn by activating appropriate ones of the intervening branch isolation switches SW1-SW4, similar to the operation of the architecture shown in FIG. 3. As in FIG. 3, in the illustrated embodiment, no port RFn is more than two branch isolation switches away from the common port RFC, and thus the insertion loss for comparably positioned ports should be about the same, yet the architecture shown in FIG. 5 supports more ports RFn than the architecture of FIG. 3 (16 versus 12 for the illustrated examples). As in FIG. 3, the added common path switches SW1-SW4 may be implemented as an independently switchable FET or stack of FETs.

The architecture shown in FIG. 5 may be particularly useful for some IC package configurations, since the signal ports RFn may be readily arrayed near the perimeter of an IC die. Further, the architecture of FIG. 4 can be combined with the architecture of FIG. 5, such that each sub-group Gn comprises multiple sub-divisions SDn.

Series-Shunt Switching Element Options

Figure 6A:
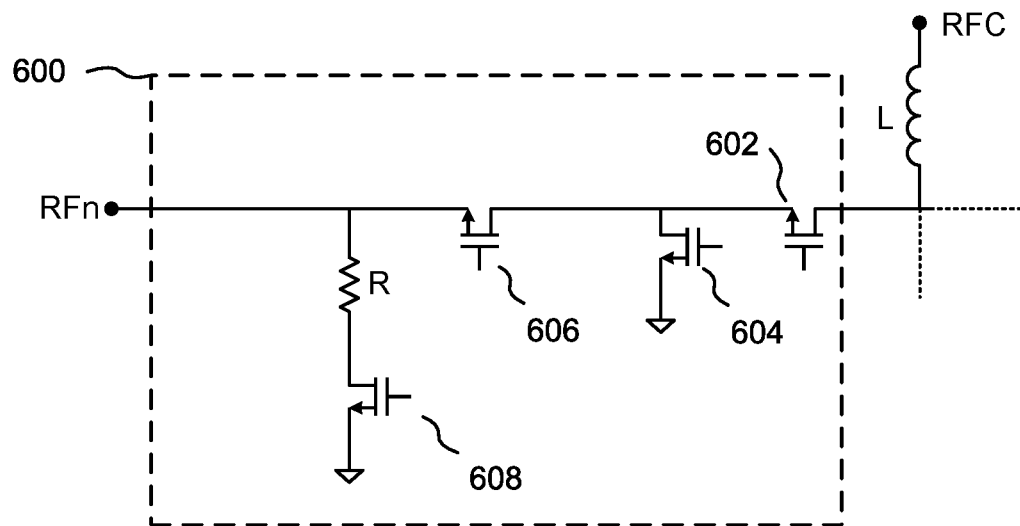
FIG. 6A is a block diagram of a high-isolation series-shunt switching element connected to a common port RFC through an inductor L as one branch of a high throw-count RF switch.

The high throw-count RF switch embodiments described above have simple series-shunt switching elements 103. However, in some applications requiring greater isolation, additional circuitry may be needed. For example, FIG. 6A is a block diagram of a high-isolation series-shunt switching element 600 connected to a common port RFC through an inductor L as one branch of a high throw-count RF switch. The high-isolation series-shunt switching element 600 includes a series switch 602 and a shunt switch 604 that operate as described above. Also included are a high-isolation switch 606, a termination resistor R, and a termination switch 608.

In operation, when series switch 602 is ON (conducting), shunt switch 604 is OFF, high-isolation switch 606 is ON, and termination switch 608 is OFF, thus coupling port RFn to the common port RFC through the inductor L. Conversely, when series switch 602 is OFF (blocking), shunt switch 604 is ON, high-isolation switch 606 is OFF, and termination switch 608 is ON, thus coupling port RFn to circuit ground through the termination resistor R.

The embodiment shown in FIG. 6A works reasonably well at relatively low RF frequencies. However, as the frequency of operation increases, the combined parasitic FET capacitance of the high-isolation switch 606 and the termination switch 608 begin to degrade both the isolation level and the termination impedance of the circuit as a whole. A solution is to provide an absorptive switch architecture suitable for use in high frequency RF applications, such as the type taught in U.S. patent application Ser. No. 14/527,168, filed Oct. 29, 2014, entitled "High Frequency Absorptive Switch Architecture", and assigned to the assignee of the present invention, the contents of which are incorporated herein by reference.

Figure 6B:
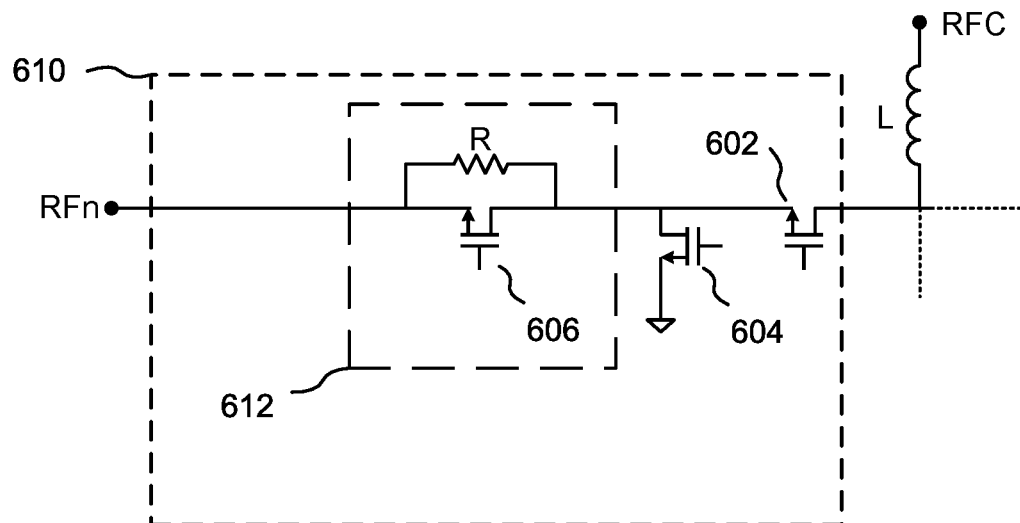
FIG. 6B is a block diagram of a high-isolation series-shunt switching element having an absorptive termination circuit and connected to a common port RFC through an inductor L as one branch of a high throw-count RF switch.

For example, FIG. 6B is a block diagram of a high-isolation series-shunt switching element 610 having an absorptive termination circuit and connected to a common port RFC through an inductor L as one branch of a high throw-count RF switch. The high-isolation series-shunt switching element 610 includes a series switch 602 and a shunt switch 604 that operate as described above. In some applications, it may be useful to use multiple parallel shunt switches 604. Also included is an absorptive switch module 612 connected in series between the series switch 602 and the port RFn. The absorptive switch module 612 includes a high-isolation switch 606 and a termination resistor R coupled in parallel with the high-isolation switch 606.

In operation, when series switch 602 is ON (conducting), shunt switch 604 is OFF and high-isolation switch 606 is ON, thus coupling port RFn to the common port RFC through the inductor L. In this mode of operation, the parallel combination of the high-isolation switch 606 resistance $R_{on}$ and the termination resistor R behaves as two resistors in parallel: $R_{on}\|R$. For RF applications, since insertion loss is critical, $R_{on}$ is set to be much less than the system characteristic impedance (generally 50 ohms for RF systems).

Conversely, when series switch 602 is OFF (blocking), shunt switch 604 is ON and high-isolation switch 606 is OFF. In this mode of operation, the high-isolation switch 606 has the characteristics of a capacitor (with value $C_{off}$) rather than a resistor (with value $R_{on}$). Thus, the parallel combination of the switch capacitance $C_{off}$ and the termination resistor R behaves as a parallel RC circuit: $C_{off}\|R$. The termination resistor R will absorb much of any signal present on the port RFn. In addition, the shunt switch 604 is partially repurposed to shunt any remaining RF signal present on the port RFn to circuit ground.

There are at least four benefits to using an absorptive switch module architecture as described above compared to traditional circuit configurations: First, the termination switch 608 of FIG. 6A is no longer needed to isolate a port RFn from the rest of the "OFF" path to the common port RFC. Accordingly, the number of distinct switch elements is reduced. Second, the parallel combination of the termination resistor R and the resistance $R_{on}$ of the high-isolation switch 606 begins to look more capacitive as frequency is increased. This is a beneficial behavior because the impedance to circuit ground of the shunt switch 604 begins to look more inductive as frequency is increased. These two reactive impedances, when added in series, substantially cancel each other and the result remains more nearly a real impedance close to a targeted characteristic impedance. Third, terminated RF power can be more consistently and completely terminated in the termination resistor R and not in the high-isolation switch 606 of the absorptive switch module 612, and power is also dissipated across one or more shunt switches 604 connected between the absorptive switch module 612 and circuit ground. Fourth, the parallel combination of the termination resistor R and the high-isolation switch 606 is very modular in nature, particularly when the switch is implemented as a FET.

Branch Isolation Switch Options

The independently switchable branch isolation switches in the various embodiments of this description may be implemented in a variety of ways. As noted above, each branch isolation switch may be implemented as a FET, or as a stack of serially-connected FETs sufficient to handle any incident voltage and concurrently operated to behave as a single single-pole, single-throw (SPST) switch.

Figure 7:
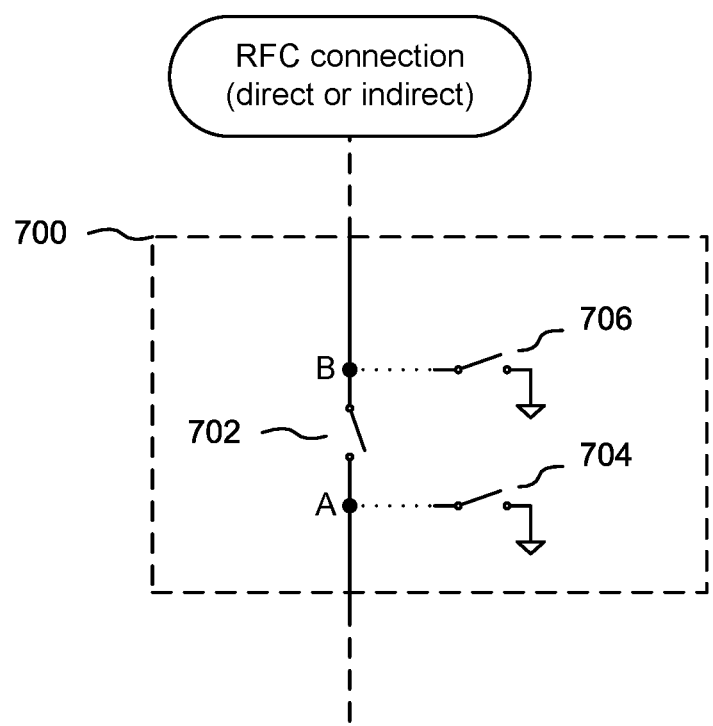
FIG. 7 is a schematic diagram of a branch isolation (BI) switch with several optional configurations.

As one example, FIG. 7 is a schematic diagram of a branch isolation (BI) switch 700 with several optional configurations. In the simplest form, the BI switch 700 may comprise an SPST series switch 702. In one variant embodiment, a first shunt switch 704 may be connected at node A to provide better isolation of circuitry coupled to the BI switch 700 on the side of node A when the series switch 702 is OPEN. Thus, when the series switch 702 is OPEN, the first shunt switch 704 would be set to CLOSED to shunt node A to circuit ground. Conversely when the series switch 702 is CLOSED, the first shunt switch 704 would be set to OPEN.

An alternative to including a dedicated first shunt switch 704 for each BI switch 700 would be to use one or more of the series-shunt switching elements 103 (referring to FIG. 3) following each BI switch 700 as a shunt to circuit ground by programming both the series switch 104 and the shunt switch 106 of such series-shunt switching element(s) 103 to be CLOSED when the BI switch 700 is OPEN, thus creating a connection to circuit ground.

In another variant embodiment, a second shunt switch 706 may be connected at node B to provide isolation on the other side of the series switch 702. Such a configuration may be useful, for example, in a switch matrix embodiment of the invention, allowing isolation of components coupled to the BI switch 700 on the side of node B.

Methods

Another aspect of the invention includes a method for switching between multiple RF signal ports, including: (a) providing a common port; (b) coupling at least two branches to the common port, each branch including at least one signal port; (c) coupling at least one branch isolation switch between the common port and a corresponding one of the at least two branches; (d) coupling a selected signal port to the common port; (e) setting any branch isolation switches between the selected signal port and the common port to a conducting state; and (f) setting all other branch isolation switches to a blocking state.

Yet another aspect of the invention includes a method for switching between multiple RF signal ports, including: (a) providing at least one common path; (b) coupling a common port to the at least one common path; (c) coupling at least two branches each including at least one signal port to one of the common paths through a series-shunt switching element; (d) coupling at least one branch isolation switch to one of the common paths between the common port and a corresponding one of the at least two branches; (e) coupling a selected signal port to the common port; (f) setting any branch isolation switches between the selected signal port and the common port to a conducting state; and (g) setting all other branch isolation switches to a blocking state.

Still another aspect of the invention includes a method for switching between multiple RF signal ports, including: (a) providing a common path; (b) coupling a common port to the common path; (c) coupling a plurality of sections each containing at least one signal port to the common path through a series-shunt switching element; (d) coupling at least one isolation switch to the common path between two adjacent sections; (e) coupling a selected signal port to the common port; (f) setting any branch isolation switches between the selected signal port and the common port to a conducting state; and (g) setting all other branch isolation switches to a blocking state.

Another aspect of the invention includes a method for switching between multiple RF signal ports, including: (a) providing a common port; (b) coupling a plurality of sub-divisions to the common port through corresponding sub-division isolation switches, each sub-division containing: (1) a common path coupled at one end to a corresponding sub-division isolation switch; (2) a plurality of sections each containing at least one signal port coupled to such common path through a series-shunt switching element; and (3) at least one section isolation switch connected to the common path between two adjacent sections; (c) coupling a selected signal port to the common port; (d) setting the sub-division isolation switch for the sub-division containing such selected signal port and any section isolation switches between the selected signal port and the common port to a conducting state; and setting all other sub-division isolation switches and section isolation switches to a blocking state.

Other aspects of the above methods may include one or more configurations in which (a) the common port is coupled between the ends of the at least one common path; (b) each branch isolation switch is a FET; each branch isolation switch comprises a stack of FETs; (c) each series-shunt switching element comprises (1) a series FET coupled between a corresponding signal port and an associated common path, and (2) a shunt FET coupled between such corresponding signal port and circuit ground; (d) the common port is disconnected and the RF switch is operated as a matrix switch allowing connection of a selected signal port to any of a selected group of other signal ports; (e) a cross-connection switch pair is coupled to each other and to the common paths of two of the plurality of sub-divisions at an end of such common paths opposite to the end coupled to a corresponding sub-division isolation switch; and/or (g) a common connection port is coupled between at least one cross-connection switch pair.

Benefits and Uses

Embodiments of the invention provide good RF performance at high frequencies with switch throw-counts of more than 8 ("8T") while exceeding the RF performance of conventional switch circuits with throw-counts of 8 or less at the same or lower frequencies. For example, a conventional 8T or 12T FET-based switch has generally been limited to about a 3 GHz broadband response with acceptable loss parameters, whereas embodiments of the invention in 12T and 16T configurations have much higher operational bandwidths (in excess of 6 GHz) with roughly equivalent or better loss parameters. In addition, for smaller throw counts such as 4T or even 6T, an improvement in the ON resistance $R_{ON}$ of the FET technology often helps further increase the operational bandwidth (i.e., narrower width FET with lower ON resistance results in lower OFF capacitance $C_{OFF}$, which extends the bandwidth).

High throw-count multiple-pole FET-based RF switches in accordance with the present invention are useful in a wide variety of circuits for performing a range of functions, including (but not limited to) impedance matching circuits, power amplifiers (e.g., scalable periphery tunable matching power amplifiers, and Doherty amplifiers), tuning circuits, RF switches, etc. Such functions are particularly useful in such applications as filters banks in test equipment, radar systems (including phased array and automotive radar systems), and radio systems. Radio system usage includes (again, without limitation) cellular radio systems (including base stations, relay stations, and hand-held transceivers) that use technologies such as orthogonal frequency-division multiplexing ("ODFM") and variants thereof, high quadrature amplitude modulation ("QAM"), Code Division Multiple Access ("CDMA"), Wide Band Code Division Multiple Access ("W-CDMA"), Worldwide Interoperability for Microwave Access ("WIMAX"), Global System for Mobile Communications ("GSM"), Enhanced Data Rates for GSM Evolution (EDGE), Long Term Evolution ("LTE"), as well as other radio communication standards and protocols.

Fabrication Technologies and Options

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

While the embodiments of the invention described above have used FET switches, the circuit architectures may be implemented with other transistor switch technologies, including the various types of bipolar junction transistors (BJTs). In addition, other switch technologies may be used, including PIN diodes and microelectromechanical system (MEMS) switches.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures, as well as BJT-based and MEMS-based switches), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, MESFET, and BJT technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 2 GHz, and particularly above about 5 GHz). Monolithic IC implementation is particularly useful since parasitic capacitances generally can be kept low by careful design.

It may be particularly useful to package integrated circuit embodiments of the invention using well-known "flip chip" (also known as "controlled collapse chip connection") processes, which allows for better physical separation between each of the signal ports RFn and the common port RFC. Such separation results in less mutual interaction (e.g., parasitic capacitances, inductive coupling) when connection such ports to external circuitry. Flip chip packaging is a method for interconnecting semiconductor devices, such as IC chips and microelectromechanical systems (MEMS), to external circuitry with solder bumps that have been deposited onto the chip (IC die) pads. The solder bumps are deposited on the chip pads on the top side of an IC wafer during the final wafer processing step. In order to mount the chip to external circuitry (e.g., a circuit board or another chip or wafer), it is flipped over so that its top side faces down, its pads are aligned with matching pads on the external circuit, and deposited solder is reflowed to complete the interconnect.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:
1. An RF switch including:
(a) a plurality of ports each coupled to a common path through a series-shunt switching element; and
(b) at least one series isolation switch each connected along the common path between a corresponding two sets of ports and configured to selectively connect or isolate the corresponding two sets of ports and configured to enable a first selected port to be coupled to a second selected port through the common path, with any series isolation switches between the first and second selected ports set to a conducting state and all other series isolation switches set to a blocking state.

2. The RF switch of claim 1, wherein the RF switch allows connection of any one port to any other port.

3. The RF switch of claim 1, wherein at least one port is a common port and at least one other port is a signal port.

4. The RF switch of claim 1, wherein at least one series isolation switch includes a series-shunt switch.

5. The RF switch of claim 1, wherein at least one series-shunt switching element is a high-isolation series-shunt switching element.

6. An RF switch including:
(a) a plurality of ports each coupled to a common path through a series-shunt switching element;
(b) a common port coupled to the common path; and
(c) at least one series isolation switch each connected along the common path between a corresponding two sets of ports and configured to selectively connect or isolate the corresponding two sets of ports and configured to enable a selected port of a first set of ports to be coupled to the common port through the common path, with any isolation switches between the selected port and the common port set to a conducting state and all other isolation switches set to a blocking state.

7. The RF switch of claim 6, wherein the common port is unconnected and the RF switch is reconfigurable to operate as a matrix switch allowing connection of any one port to any other port.

8. The RF switch of claim 6, wherein at least one series isolation switch includes a series-shunt switch.

9. The RF switch of claim 6, wherein at least one series-shunt switching element is a high-isolation series-shunt switching element.

10. The RF switch of claim 6, further including a termination circuit operatively coupled to the common port.

11. An RF switch including:
(a) at least one common path;
(b) at least one common port coupled to the at least one common path;
(c) at least three sections each containing at least one signal port coupled to at least one common path through a series-shunt switching element; and
(d) at least two isolation switches each connected to at least one common path between two corresponding adjacent sections, each isolation switch including at least one series switch configured to selectively connect or isolate the two corresponding adjacent sections;
wherein when a selected signal port is coupled to at least one common port through at least one common path, any isolation switches between the selected signal port and the at least one common port are configured in a conducting state.

12. The RF switch of claim 11, wherein when the selected signal port is coupled to at least one common port through at least one common path, any isolation switches between the selected signal port and the at least one common port are configured in a conducting state and all other isolation switches are configured in a blocking state.

13. The RF switch of claim 11, wherein at least one common port of the at least one common port is coupled between the ends of two of the common paths to define at least two groups of sections.

14. The RF switch of claim 11, wherein at least one isolation switch series switch has a first terminal and a second terminal each connected to corresponding adjacent sections, and further including a shunt switch coupled between the first terminal and circuit ground.

15. The RF switch of claim 14, wherein at least one isolation switch series switch has a first terminal and a second terminal each connected to corresponding adjacent sections, and further including a shunt switch coupled between the second terminal and circuit ground.

16. The RF switch of claim 11, wherein the at least one series switch comprises one or more series-connected FETs.

17. The RF switch of claim 11, wherein at least one series-shunt switching element comprises (1) a series FET coupled between a corresponding signal port and one of the at least one common path, and (2) a shunt FET coupled between such corresponding signal port and circuit ground.

18. The RF switch of claim 11, wherein each common port is unconnected and the RF switch is configured to operate as a matrix switch allowing connection of a selected signal port to any of a selected group of other signal ports.

19. The RF switch of claim 11, wherein at least one series-shunt switching element is a high-isolation series-shunt switching element.

20. The RF switch of claim 11, further including a termination circuit operatively coupled to the common port.

\* \* \* \* \*